US012255049B2

(12) United States Patent
Nagami et al.

(10) Patent No.: US 12,255,049 B2
(45) Date of Patent: Mar. 18, 2025

(54) PLASMA PROCESSING APPARATUS AND PLASMA PROCESSING METHOD

(71) Applicant: TOKYO ELECTRON LIMITED, Tokyo (JP)

(72) Inventors: Koichi Nagami, Miyagi (JP); Kazuya Nagaseki, Miyagi (JP); Shinji Himori, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 133 days.

(21) Appl. No.: 16/674,506

(22) Filed: Nov. 5, 2019

(65) Prior Publication Data
US 2020/0144028 A1    May 7, 2020

(30) Foreign Application Priority Data

Nov. 5, 2018  (JP) .................................. 2018-208007

(51) Int. Cl.
*H01L 21/00*    (2006.01)
*H01J 37/32*    (2006.01)

(52) U.S. Cl.
CPC .. *H01J 37/32027* (2013.01); *H01J 37/32082* (2013.01); *H01J 37/32266* (2013.01); *H01J 37/32577* (2013.01)

(58) Field of Classification Search
CPC ................................................ H01J 37/32027
See application file for complete search history.

(56) References Cited

U.S. PATENT DOCUMENTS

| 5,928,528 | A  | * | 7/1999  | Kubota ............. H01L 21/32137 216/67 |
| 6,165,376 | A  | * | 12/2000 | Miyake ................. C23C 16/515 216/67 |
| 9,583,360 | B2 | * | 2/2017  | Ui ..................... H01J 37/32174 |
| 2007/0215180 | A1 | * | 9/2007 | Iijima ............... H01L 21/67276 134/18 |

(Continued)

FOREIGN PATENT DOCUMENTS

| JP | H10-004085 A | 1/1998 |
| JP | H11-224796 A | 8/1999 |
| JP | 2012-079886 A | 4/2012 |

OTHER PUBLICATIONS

J.P. 2019-192872, Nagaumi et al., Plasma Processing Device and method for controlling power supply, Oct. 31, 2019, abstract. (Year: 2019).*

*Primary Examiner* — Sylvia MacArthur
*Assistant Examiner* — Michelle Crowell
(74) *Attorney, Agent, or Firm* — XSENSUS LLP (57) ABSTRACT

A plasma processing apparatus includes a chamber and a substrate support provided in the chamber. A power supply unit is connected to a lower electrode of the substrate support. The power supply unit applies a first DC voltage to the lower electrode during generation of plasma from an etching gas in the chamber. The first DC voltage is a positive DC voltage. The power supply unit applies a second DC voltage to the lower electrode during the generation of plasma from the etching gas in the chamber, to etch the substrate placed on the substrate support. The second DC voltage is a negative DC voltage. The DC voltage output by the power supply unit is continuously switched from the first DC voltage to the second DC voltage.

22 Claims, 3 Drawing Sheets

(56) References Cited

U.S. PATENT DOCUMENTS

| | | | |
|---|---|---|---|
| 2009/0269171 A1* | 10/2009 | Iijima | H01L 21/67253 |
| | | | 414/222.01 |
| 2010/0072172 A1* | 3/2010 | Ui | H01J 37/32009 |
| | | | 216/67 |
| 2010/0220081 A1* | 9/2010 | Yatsuda | H01J 37/32027 |
| | | | 345/60 |
| 2012/0247677 A1* | 10/2012 | Himori | H01J 37/32091 |
| | | | 156/345.44 |
| 2013/0048606 A1* | 2/2013 | Mao | C23F 4/00 |
| | | | 216/67 |
| 2013/0049592 A1* | 2/2013 | Yeom | H01J 37/32706 |
| | | | 315/111.21 |
| 2015/0325413 A1* | 11/2015 | Kim | H01J 37/32449 |
| | | | 315/111.21 |
| 2016/0056017 A1* | 2/2016 | Kim | H01J 37/321 |
| | | | 156/345.28 |
| 2017/0169997 A1* | 6/2017 | Moriguchi | H01J 37/32715 |
| 2017/0250056 A1* | 8/2017 | Boswell | H02M 3/33507 |
| 2019/0122893 A1* | 4/2019 | Choi | H01L 21/32135 |
| 2019/0333744 A1* | 10/2019 | Nagami | H01J 37/32724 |
| 2020/0135527 A1* | 4/2020 | Sung | H01J 37/32642 |
| 2020/0144031 A1* | 5/2020 | Tamamushi | H01L 21/32136 |

\* cited by examiner

PLASMA PROCESSING APPARATUS AND PLASMA PROCESSING METHOD

CROSS-REFERENCE TO RELATED APPLICATIONS

This application is based on and claims priority from Japanese Patent Application No. 2018-208007, filed on Nov. 5, 2018, with the Japan Patent Office, the disclosure of which is incorporated herein in its entirety by reference.

TECHNICAL FIELD

The present disclosure relates to a plasma processing apparatus and a plasma processing method.

BACKGROUND

A plasma processing apparatus is used in a plasma etching of a substrate. The plasma processing apparatus includes a chamber and a substrate support. The substrate support includes a lower electrode and is provided in the chamber. When the plasma etching is performed, the substrate is placed on the substrate support. Then, plasma is generated from a gas in the chamber. The substrate is etched by the positive ions from the plasma, and openings are formed in the substrate.

The substrate is charged as the etching of the substrate with the positive ions is progressed. When the substrate is charged, the amount of positive ions supplied into the openings decreases, then the etching rate may be reduced. Or, when the substrate is charged, a shape abnormality may occur in the openings formed in the substrate.

In Japanese Patent Laid-Open Publication No. 2012-079886, a positive DC voltage is applied from a power supply to the lower electrode, to reduce the positive charge amount of the substrate. Subsequently, the application of the DC voltage to the lower electrode is stopped. Subsequently, a negative DC voltage is applied from a power supply to the lower electrode. As a result, positive ions are drawn into the substrate, and etching is performed. Thereafter, the application of the DC voltage to the lower electrode is stopped. In Japanese Patent Laid-Open Publication No. 2012-079886, the application of the positive DC voltage to the lower electrode, the stop of the application of the DC voltage to the lower electrode, the application of the negative DC voltage to the lower electrode, and the stop of the application of the DC voltage to the lower electrode are repeated.

SUMMARY

An exemplary embodiment of the present disclosure provides a plasma processing apparatus. The plasma processing apparatus includes a chamber, a substrate support, a radio-frequency power supply, and a power supply unit (bias power supply). The substrate support includes a lower electrode and is provided in the chamber. The radio-frequency power supply is configured to supply a radio-frequency power to generate plasma from a gas in the chamber. The power supply unit is configured to generate a positive DC voltage and a negative DC voltage. The power supply unit is electrically connected to the lower electrode. The power supply unit stops an application of a DC voltage to the lower electrode in a first time period during which plasma is being generated from an etching gas in the chamber. The power supply unit applies a first DC voltage to the lower electrode in a second time period during which the plasma is being generated from the etching gas in the chamber after the first time period. The first DC voltage is a positive DC voltage. The power supply unit applies a second DC voltage to the lower electrode in a third time period during which the plasma is being generated from the etching gas in the chamber after the second time period, in order to etch the substrate placed on the substrate support. The second DC voltage is a negative DC voltage. The DC voltage output by the power supply unit is continuously switched from the first DC voltage in the second time period to the second DC voltage in the third time period.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Various exemplary embodiments will be described hereinafter.

An exemplary embodiment provides a plasma processing apparatus. The plasma processing apparatus includes a chamber, a substrate support, a radio-frequency power supply, and a power supply unit. The substrate support includes a lower electrode and is provided in the chamber. The radio-frequency power supply is configured to supply a radio-frequency power to generate plasma from a gas in the chamber. The power supply unit is configured to generate a positive DC voltage and a negative DC voltage. The power supply unit is electrically connected to the lower electrode. The power supply unit stops the application of a DC voltage to the lower electrode in a first time period during which plasma is being generated from an etching gas in the chamber. The power supply unit applies a first DC voltage to the lower electrode in a second time period during which the plasma is being generated from the etching gas in the chamber after the first time period. The first DC voltage is a positive DC voltage. The power supply unit applies a second DC voltage to the lower electrode in a third time period during which the plasma is being generated from the etching gas in the chamber after the second time period, in order to etch the substrate placed on the substrate support. The second DC voltage is a negative DC voltage. The DC voltage output by the power supply unit is continuously switched from the first DC voltage in the second time period to the second DC voltage in the third time period.

When the positive DC voltage is applied to the lower electrode during the generation of plasma, negative ions and/or electrons are supplied from the plasma to the substrate. As a result, according to the embodiment, the positive charge quantity of the substrate decreases in the second time period. When the negative DC voltage is applied to the lower electrode during the generation of plasma, positive ions from the plasma are accelerated toward the substrate. As a result, according to the embodiment, the substrate is etched at a high etching rate in the third time period. Further, since the DC voltage output by the power supply unit is continuously switched from the first DC voltage in the second time period to the second DC voltage in the third time period, the energy of positive ions that collide with the substrate in the third time period is further enhanced. Thus, according to the embodiment, the etching rate is further improved.

In an exemplary embodiment, the absolute value of the first DC voltage is smaller than the absolute value of the second DC voltage.

In an exemplary embodiment, the time length of the third time period is equal to or shorter than the sum of the time length of the first time period and the time length of the second time period.

In an exemplary embodiment, the time length of the third time period may be 10 μsec or shorter.

In an exemplary embodiment, the time length of the second time period may be equal to or shorter than the time length of the first time period.

In an exemplary embodiment, the power supply unit may repeat the stop of the application of the DC voltage to the lower electrode in the first time period, the application of the first DC voltage to the lower electrode in the second time period, and the application of the second DC voltage to the lower electrode in the third time period.

In an exemplary embodiment, the power supply unit applies a third DC voltage to the lower electrode in a fourth time period during which plasma is being generated from a cleaning gas in the chamber. The third DC voltage is a negative DC voltage. The power supply unit further stops the application of the DC voltage to the lower electrode in a fifth time period during which the plasma is being generated from the cleaning gas in the chamber after the fourth time period. The power supply unit applies a fourth DC voltage to the lower electrode in a sixth time period during which the plasma is being generated from the cleaning gas in the chamber after the fifth time period. The fourth DC voltage is a positive DC voltage. The time length of the fourth time period is longer than the sum of the time length of the fifth time period and the time length of the sixth time period. When the time length of the fourth time period is relatively long, the potential of plasma becomes high in the sixth time period. Since the positive DC voltage is applied to the lower electrode in the sixth time period, ions are accelerated from the plasma toward the inner wall surface of the chamber. As a result, deposits adhering to the inner wall surface of the chamber are removed.

In an exemplary embodiment, the time length of the fourth time period may be longer than the time length of the third time period.

In an exemplary embodiment, the power supply unit may repeat the application of the third DC voltage to the lower electrode in the fourth time period, the stop of the application of the DC voltage to the lower electrode in the fifth time period, and the application of the fourth DC voltage to the lower electrode in the sixth time period.

Another exemplary embodiment provides a plasma processing method performed using a plasma processing apparatus. The plasma processing apparatus includes a chamber, a substrate support, a radio-frequency power supply, and a power supply unit. The substrate support includes a lower electrode and is provided in the chamber. The radio-frequency power supply is configured to supply a radio-frequency power to generate plasma from a gas in the chamber. The power supply unit is configured to generate a positive DC voltage and a negative DC voltage, and is electrically connected to the lower electrode. The plasma processing method includes a step of stopping the application of a DC voltage from the power supply unit to the lower electrode in a first time period during which plasma is being generated from an etching gas in the chamber. The plasma processing method further includes a step of applying a first DC voltage from the power supply unit to the lower electrode in a second time period during which the plasma is being generated from the etching gas in the chamber after the first time period. The first DC voltage is a positive DC voltage. The plasma processing method further includes a step of applying a second DC voltage from the power supply unit to the lower electrode in a third time period during which the plasma is being generated from the etching gas in the chamber after the second time period, in order to etch the substrate placed on the substrate support. The second DC voltage is a negative DC voltage. The DC voltage output by the power supply unit is continuously switched from the first DC voltage in the second time period to the second DC voltage in the third time period.

In an exemplary embodiment, the absolute value of the first DC voltage is smaller than the absolute value of the second DC voltage.

In an exemplary embodiment, the time length of the third time period is equal to or shorter than the sum of the time length of the first time period and the time length of the second time period.

In an exemplary embodiment, the time length of the third time period may be 10 μsec or shorter.

In an exemplary embodiment, the time length of the second time period may be equal to or shorter than the first time period.

In an exemplary embodiment, the stopping step, the step of applying the first DC voltage, and the step of applying the second DC voltage may be repeated.

In an exemplary embodiment, the plasma processing method further includes a step of applying a third DC voltage from the power supply unit to the lower electrode in a fourth time period during which plasma is being generated from a cleaning gas in the chamber. The third DC voltage is a negative DC voltage. The plasma processing method further includes a step of further stopping the application of the DC voltage from the power supply unit to the lower electrode in a fifth time period during which the plasma is being generated from the cleaning gas in the chamber after the fourth time period. The plasma processing method further includes a step of applying a fourth DC voltage from the power supply unit to the lower electrode in a sixth time period during which the plasma is being generated from the cleaning gas in the chamber after the fifth time period. The fourth DC voltage is a positive DC voltage. The time length of the fourth time period is longer than the sum of the time length of the fifth time period and the time length of the sixth time period.

In an exemplary embodiment, the time length of the fourth time period may be longer than the time length of the third time period.

In an exemplary embodiment, the step of applying the third DC voltage, the further stopping step, and the step of applying the fourth DC voltage may be repeated.

Hereinafter, various embodiments will be described in detail with reference to the drawings. Meanwhile, in the respective drawings, similar or corresponding portions will be denoted by the same reference numerals.

Figure 1:
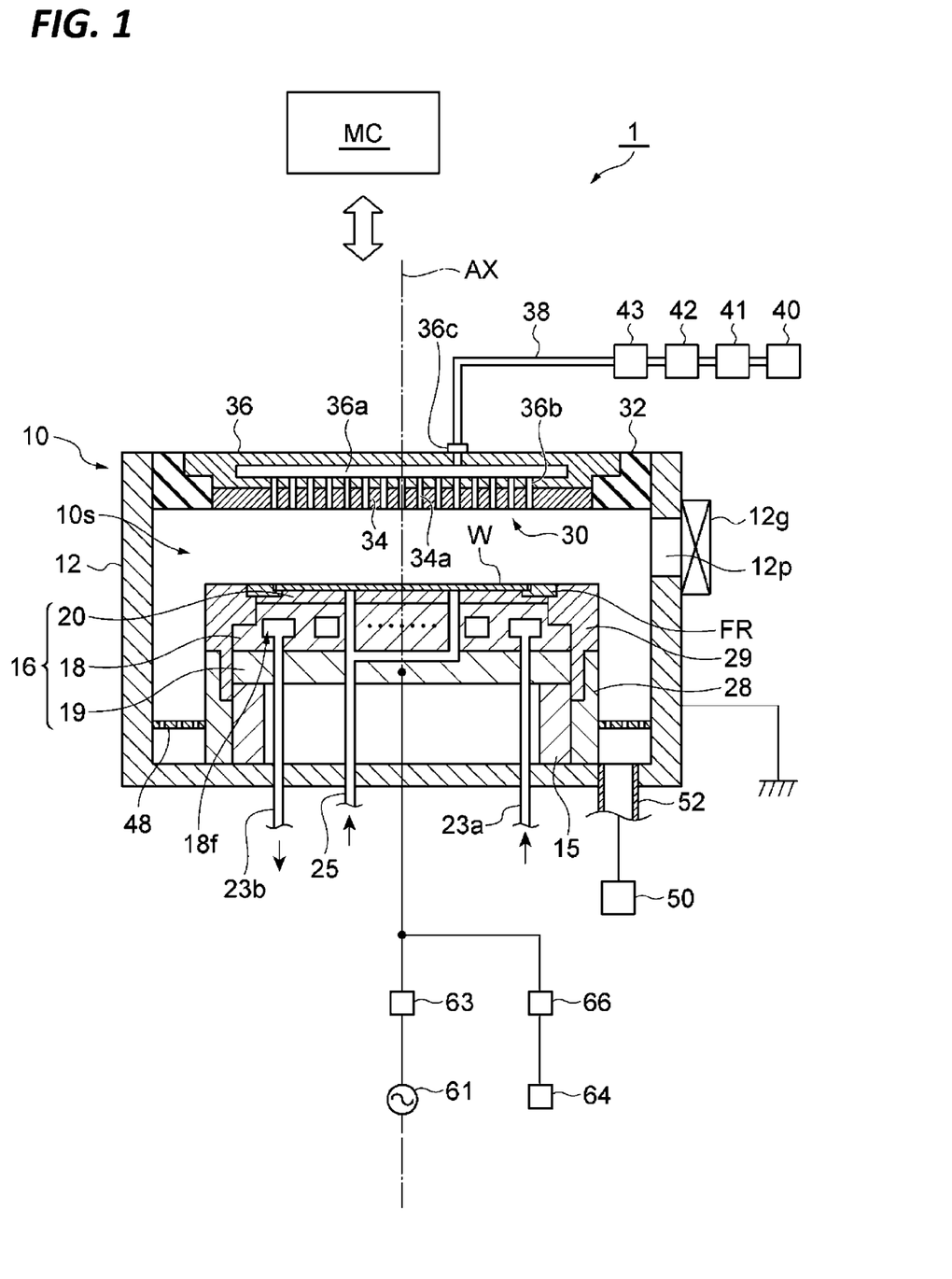
FIG. 1 is a view schematically illustrating a plasma processing apparatus according to an exemplary embodiment.

FIG. 1 is a view schematically illustrating a plasma processing apparatus according to an exemplary embodiment. A plasma processing apparatus 1 illustrated in FIG. 1 is a capacitively coupled plasma processing apparatus. The plasma processing apparatus 1 includes a chamber 10. The chamber 10 provides an internal space 10s therein. In an exemplary embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A plasma-resistant film is formed on the inner wall surface of the chamber body 12, that is, the wall surface of the chamber body 12 that defines the internal space 10s. The film may be a film made of ceramic such as a film formed by anodization or a film formed of yttrium oxide.

A passage 12p is formed in the side wall of the chamber body 12. A substrate W passes through the passage 12p when being transferred between the internal space 10s and the outside of the chamber 10. A gate valve 12g is provided along the side wall of the chamber body 12 to open/close the passage 12p.

A substrate support, that is, a support stage 16 is provided in the chamber 10. The support stage 16 is configured to support the substrate W placed thereon. The substrate W has a substantially disk shape. The support stage 16 is supported by a support 15. The support 15 extends upward from the bottom of the chamber body 12. The support 15 has a substantially cylindrical shape. The support 15 is made of an insulating material such as quartz.

The support stage 16 has a lower electrode 18. The support stage 16 may further include an electrostatic chuck 20. The support stage 16 may further include an electrode plate 19. The electrode plate 19 is made of a conductive material such as aluminum, and has a substantially disk shape. The lower electrode 18 is provided on the electrode plate 19. The lower electrode 18 is made of a conductive material such as aluminum, and has a substantially disk shape. The lower electrode 18 is electrically connected to the electrode plate 19.

A flow path 18f is formed in the lower electrode 18. The flow path 18f is a flow path for a heat exchange medium. As the heat exchange medium, a liquid refrigerant or a refrigerant that cools the lower electrode 18 by vaporization thereof (e.g., freon) is used. A circulation device (e.g., a chiller unit) for the heat exchange medium is connected to the flow path 18f. The circulation device is provided outside the chamber 10. The heat exchange medium is supplied from the circulation device to the flow path 18f through a pipe 23a. The heat exchange medium supplied to the flow path 18f is returned to the circulation device through a pipe 23b.

The electrostatic chuck 20 is provided on the lower electrode 18. When the substrate W is processed in the internal space 10s, the substrate W is placed on the electrostatic chuck 20 and held by the electrostatic chuck 20. The electrostatic chuck 20 includes a main body and an electrode. The main body of the electrostatic chuck 20 is made of a dielectric such as aluminum oxide or aluminum nitride. The main body of the electrostatic chuck 20 has a substantially disk shape. The electrostatic chuck 20 includes a substrate placement area and a focus ring mounting area. The substrate placement area has a substantially disk shape. The upper surface of the substrate placement area extends along the horizontal plane. An axis AX that includes the center of the substrate placement area and extends in the vertical direction substantially coincides with the center axis of the chamber 10. When the substrate W is processed in the chamber 10, the substrate W is placed on the upper surface of the substrate placement area.

The focus ring mounting area extends circumferentially so as to surround the substrate placement area. A focus ring FR is mounted on the upper surface of the focus ring mounting area. The focus ring FR has a ring shape. The substrate W is placed in the area surrounded by the focus ring FR. That is, the focus ring FR surrounds the edge of the substrate W placed on the substrate placement area of the electrostatic chuck 20. The focus ring FR is made of, for example, silicon or silicon carbide.

The electrode of the electrostatic chuck 20 is provided in the main body of the electrostatic chuck 20. The electrode of the electrostatic chuck 20 is a film formed of a conductor. A DC power supply is electrically connected to the electrode of the electrostatic chuck 20. When a DC voltage is applied from the DC power supply to the electrode of the electrostatic chuck 20, an electrostatic attractive force is generated between the electrostatic chuck 20 and the substrate W. Due to the generated electrostatic attractive force, the substrate W is attracted to the electrostatic chuck 20 and held by the electrostatic chuck 20.

The plasma processing apparatus 1 may further include a gas supply line 25. The gas supply line 25 supplies a heat transfer gas from a gas supply mechanism, for example, He gas to the space between the upper surface of the electrostatic chuck 20 and the back surface (lower surface) of the substrate W.

The plasma processing apparatus 1 may further include a cylindrical portion 28 and an insulating portion 29. The cylindrical portion 28 extends upward from the bottom of the chamber body 12. The cylindrical portion 28 extends along the outer periphery of the support 15. The cylindrical portion 28 is formed of a conductive material and has a substantially cylindrical shape. The cylindrical portion 28 is electrically grounded. The insulating portion 29 is provided on the cylindrical portion 28. The insulating portion 29 is formed of a material having an insulating property. For example, the insulating portion 29 is formed of ceramic such as quartz. The insulating portion 29 has a substantially cylindrical shape. The insulating portion 29 extends along the outer periphery of the electrode plate 19, the outer periphery of the lower electrode 18, and the outer periphery of the electrostatic chuck 20.

The plasma processing apparatus 1 further includes an upper electrode 30. The upper electrode 30 is provided above the support stage 16. The upper electrode 30 closes the upper opening of the chamber body 12 together with a member 32. The member 32 has an insulating property. The upper electrode 30 is supported in the upper portion of the chamber body 12 via the member 32.

The upper electrode 30 includes a top plate 34 and a support 36. The lower surface of the top plate 34 defines the internal space 10s. A plurality of gas ejection holes 34a are formed in the top plate 34. Each of the plurality of gas ejection holes 34a penetrates the top plate 34 in the plate thickness direction of the top plate 34 (vertical direction). While the top plate 34 is not limited, the top plate 34 is formed of, for example, silicon. Alternatively, the top plate 34 may have a structure in which a plasma-resistant film is provided on the surface of an aluminum member. The film may be a film made of ceramic such as a film formed by anodization or a film formed of yttrium oxide.

The support 36 detachably supports the top plate 34. The support 36 is formed of a conductive material such as, for example, aluminum. A gas diffusion chamber 36a is provided inside the support 36. A plurality of gas holes 36b extend downward from the gas diffusion chamber 36a. The plurality of gas holes 36b communicate with the plurality of gas ejection holes 34a, respectively. A gas inlet port 36c is formed in the support 36. The gas inlet port 36c is connected to the gas diffusion chamber 36a. A gas supply pipe 38 is connected to the gas inlet port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply. The gas source group 40 includes a plurality of gas sources. The plurality of gas sources include sources of a plurality of gases used in plasma processing methods according to various embodiments. The plurality of gases include an etching gas and an cleaning gas. Each of the valve group 41 and the valve group 43 includes a plurality of valves (e.g., open/close valves). The flow rate controller group 42 includes a plurality of flow rate controllers. Each of the plurality of flow rate controllers in the flow rate controller group 42 is a mass flow controller or a pressure control type flow rate controller. Each of the plurality of gas sources in the gas source group 40 is connected to the gas supply pipe 38 via a corresponding valve of the valve group 41, a corresponding flow rate controller of the flow rate controller group 42, and a corresponding valve of the valve group 43. The plasma processing apparatus 1 may supply gases from one or more gas sources selected from the plurality of gas sources in the gas source group 40 to the internal space 10s at individually adjusted flow rates.

A baffle member 48 is provided between the cylindrical portion 28 and the side wall of the chamber body 12. The baffle member 48 may be a plate-shaped member. The baffle member 48 may be configured by, for example, coating a plate material made of aluminum with ceramic such as yttrium oxide. In the baffle member 48, a plurality of through holes are formed. An exhaust pipe 52 is connected to the bottom of the chamber body 12, below the baffle member 48. An exhaust device 50 is connected to the exhaust pipe 52. The exhaust device 50 includes a pressure controller such as an automatic pressure control valve and a vacuum pump such as a turbo molecular pump, and thus, may reduce the pressure in the internal space 10s.

The plasma processing apparatus 1 further includes a radio-frequency power supply 61. The radio-frequency power supply 61 generates a radio-frequency power for generating plasma. The frequency of the radio-frequency power is not limited, but is a frequency within a range of 27 MHz to 100 MHz, for example, 40 MHz or 60 MHz. The radio-frequency power supply 61 is connected to the lower electrode 18 via a matching unit 63 and the electrode plate 19, in order to supply a radio-frequency power to the lower electrode 18. The matching unit 63 includes a matching circuit for matching the output impedance of the radio-frequency power supply 61 and the impedance of a load side (the lower electrode 18) with each other. In addition, the radio-frequency power supply 61 may not be electrically connected to the lower electrode 18, and may be connected to the upper electrode 30 via the matching unit 63.

The plasma processing apparatus 1 further includes a power supply unit 64. The power supply unit 64 is configured to generate a DC voltage to be applied to the lower electrode 18. The power supply unit 64 is configured to generate a negative DC voltage and a positive DC voltage. The power supply unit 64 is electrically connected to the lower electrode 18. In an embodiment, the power supply unit 64 is connected to an electrical path that connects the matching unit 63 and the electrode plate 19 to each other via a low-pass filter 66. Details of the operation of the power supply unit 64 will be described later.

In the plasma processing apparatus 1, a gas is supplied to the internal space 10s. Then, when a radio-frequency power is supplied, the gas is excited in the internal space 10s. As a result, plasma is generated in the internal space 10s. The substrate W is processed by chemical species such as ions and/or radicals from the generated plasma. Alternatively, the inner wall surface of the chamber 10 is cleaned by chemical species such as ions and/or radicals from the generated plasma.

The plasma processing apparatus 1 further includes a controller MC. The controller MC is a computer that includes, for example, a processor, a storage device, an input device, and a display device, and controls each unit of the plasma processing apparatus 1. Specifically, the controller MC executes a control program stored in the storage device, and controls each unit of the plasma processing apparatus 1 based on recipe data stored in the storage device. A process specified by the recipe data is performed in the plasma processing apparatus 1 through the control by the controller MC. The plasma processing methods according to various embodiments may be performed in the plasma processing apparatus 1 through the control of each unit of the plasma processing apparatus 1 by the controller MC.

Figure 2:
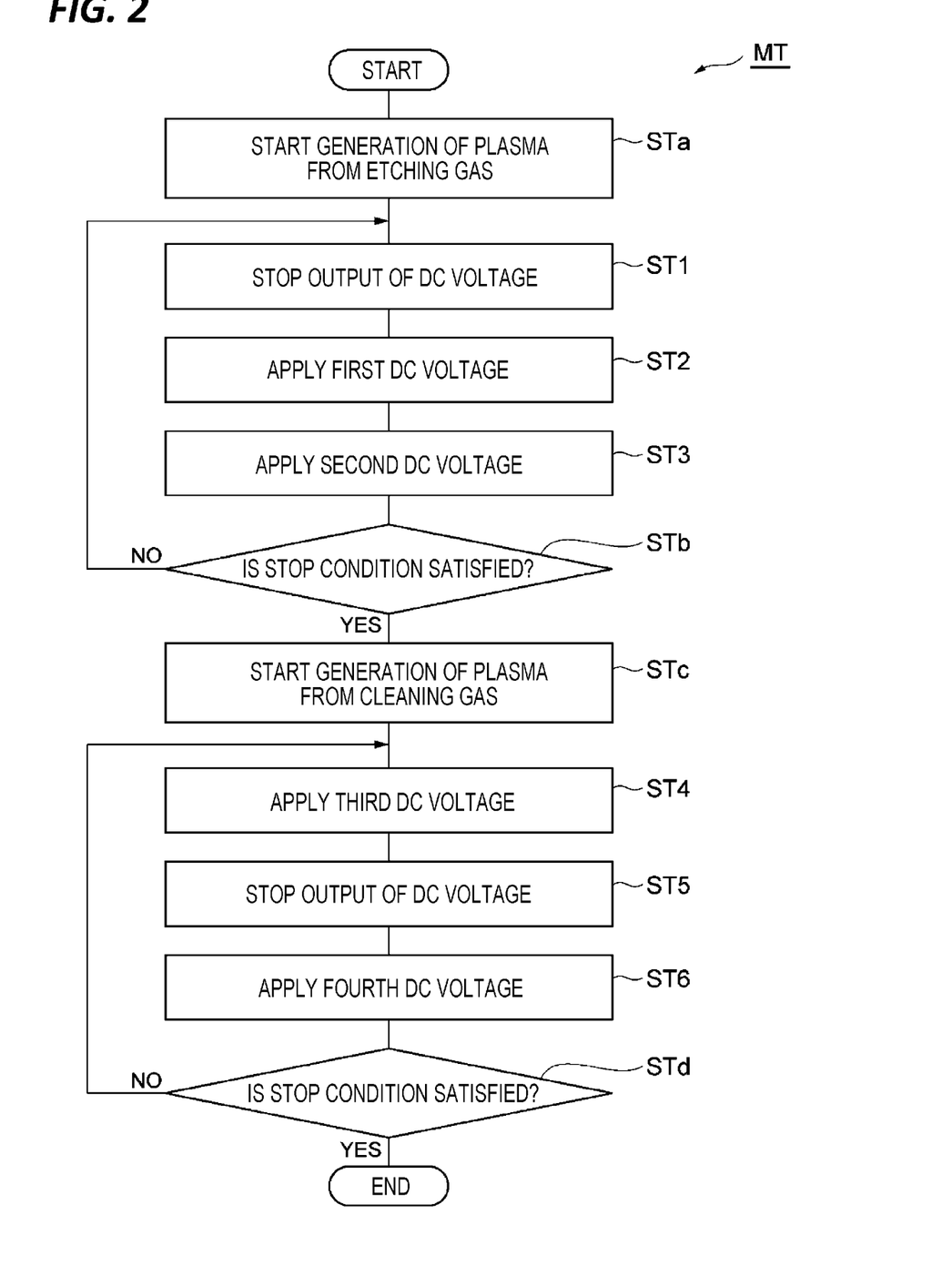
FIG. 2 is a flowchart illustrating a plasma processing method according to an exemplary embodiment.
Figure 3:
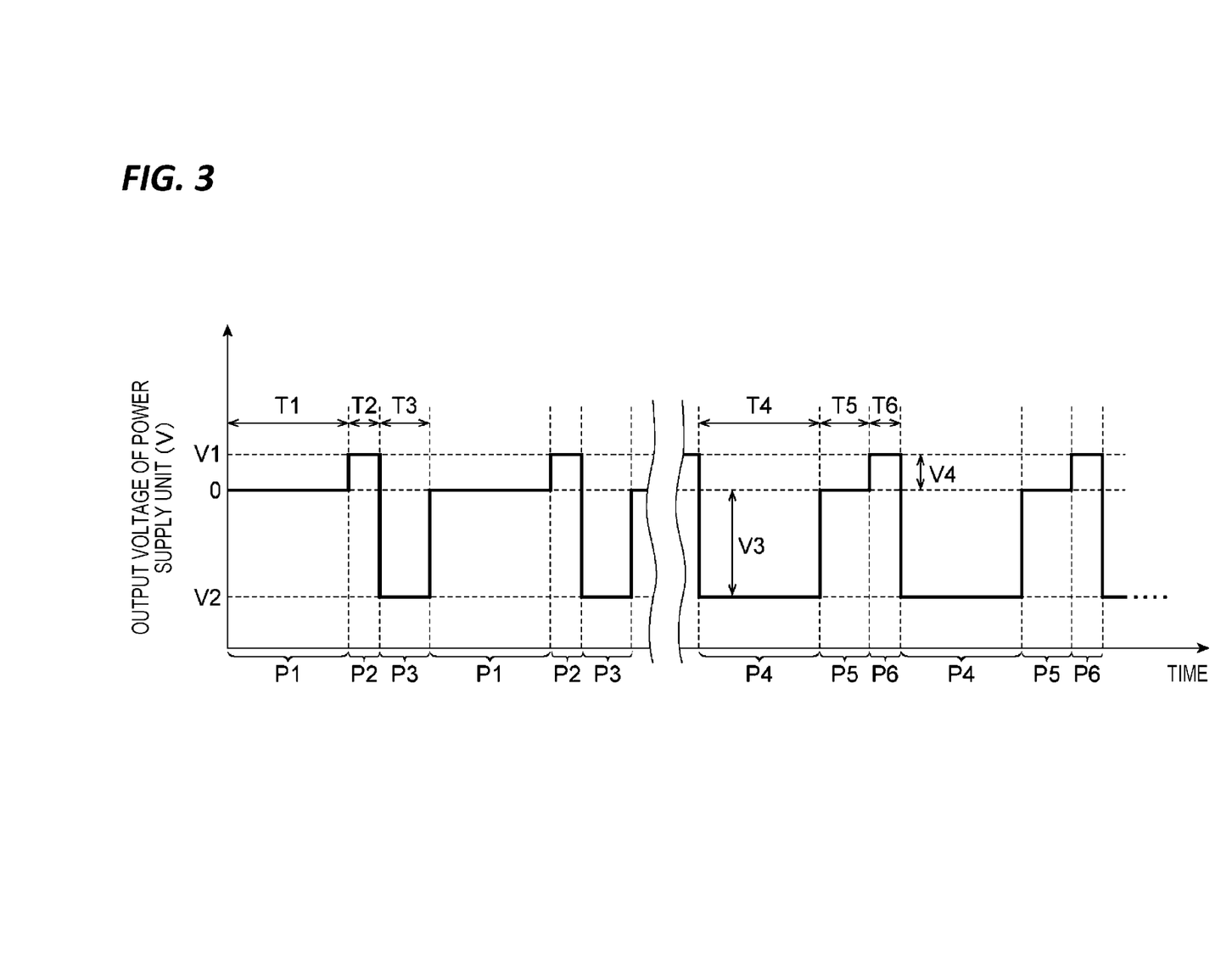
FIG. 3 is a timing chart of an example of an output voltage of a power supply unit in the plasma processing method illustrated in FIG. 2.

Hereinafter, a plasma processing method according to an exemplary embodiment will be described with reference to FIGS. 2 and 3. FIG. 2 is a flowchart illustrating a plasma processing method according to an exemplary embodiment. FIG. 3 is a timing chart of an example of an output voltage of the power supply unit in the plasma processing method illustrated in FIG. 2. Hereinafter, the operation of each unit of the plasma processing apparatus 1 in the plasma processing method illustrated in FIG. 2 (hereinafter, referred to as the "method MT") will also be described.

As illustrated in FIG. 2, in step STa of the method MT, the generation of plasma from an etching gas is started. The etching gas is a gas used for the plasma etching of the substrate W. In step STa, the controller MC controls the gas supply to supply the etching gas into the chamber 10. In step STa, the controller MC controls the exhaust device 50 to set the pressure in the chamber 10 to a specified pressure. In step STa, the controller MC controls the radio-frequency power supply 61 to supply a radio-frequency power to the lower electrode 18 (or the upper electrode 30).

The method MT includes steps ST1, ST2, and ST3. Steps ST1, ST2, and ST3 are performed during the generation of plasma from the etching gas that is started in step STa. The performance time period of step ST1 is a first time period P1. The performance time period of step ST2 is a second time period P2. The performance time period of step ST3 is a third time period P3. In order to generate plasma from the etching gas, the radio-frequency power may be continuously supplied over the first time period P1, the second time period P2, and the third time period P3.

Step ST1 is performed in the first time period P1. The first time period P1 is a time period during which plasma is being generated from the etching gas in the chamber 10. Step ST1 includes stopping the application of the DC voltage from the power supply unit 64 to the lower electrode 18 in the first time period P1. In order to perform step ST1, the controller MC controls the power supply unit 64 to stop the output of the DC voltage to the lower electrode 18 in the first time period P1.

Step ST2 is performed in the second time period P2. The second time period P2 is a time period during which the plasma is being generated from the etching gas in the chamber 10 after the first time period P1. Step ST2 includes applying a first DC voltage V1 from the power supply unit 64 to the lower electrode 18 in the second time period P2. The first DC voltage V1 is a positive DC voltage. In order to perform step ST2, the controller MC controls the power supply unit 64 to apply the first DC voltage V1 to the lower electrode 18 in the second time period P2.

Step ST3 is performed in the third time period P3. The third time period P3 is a time period during which the plasma is being generated from the etching gas in the chamber 10 after the second time period P2. Step ST3 includes applying a second DC voltage V2 from the power supply unit 64 to the lower electrode 18 in the third time period P3. The second DC voltage V2 is a negative DC voltage. In an embodiment, as illustrated in FIG. 3, the absolute value |V1| of the first DC voltage is smaller than the absolute value |V2| of the second DC voltage. The absolute value |V2| of the second DC voltage may be set to 3 kV or more when deep holes are formed in the substrate W. The absolute value |V2| of the second DC voltage may be set to 500 V or less when etching of polysilicon for forming a gate is performed. The absolute value |V2| of the second DC voltage may be set to 5 V or more and 300 V or less when etching for patterning of polysilicon is performed. In order to perform step ST3, the controller MC controls the power supply unit 64 to apply the second DC voltage V2 to the lower electrode 18 in the third time period P3.

The DC voltage output by the power supply unit 64 is continuously switched from the first DC voltage V1 in the second time period P2 to the second DC voltage V2 in the third time period P3. That is, the end time point of the second time period P2 at which the power supply unit 64 stops the output of the first DC voltage V1, and the start time point of the third time period P3 at which the power supply unit 64 starts the output of the second DC voltage V2 are identical or subsequent to each other.

In an embodiment, as illustrated in FIG. 3, the time length T3 of the third time period P3 is equal to or shorter than the sum of the time length T1 of the first time period P1 and the time length T2 of the second time period P2. That is, the equation T3≤T1+T2 is satisfied. In other words, the ratio occupied by the third time period P3 in the time period that includes the first time period P1, the second time period P2, and the third time period P3 (e.g., the duty ratio) is equal to or less than 50%. The time length T3 of the third time period P3 is, for example, 10 μsec or shorter. In an embodiment, as illustrated in FIG. 3, the time length T2 of the second time period P2 may be equal to or shorter than the time length T1 of the first time period P1.

When a positive DC voltage is applied to the lower electrode 18 during the generation of plasma, negative ions and/or electrons are supplied from the plasma to the substrate W. As a result, the positive charge quantity of the substrate W decreases in the second time period P2. When a negative DC voltage is applied to the lower electrode 18 during the generation of plasma, positive ions from the plasma are accelerated toward the substrate W. As a result, the substrate W is etched at a high etching rate in the third time period P3. Further, since the DC voltage output by the power supply unit 64 is continuously switched from the first DC voltage V1 in the second time period P2 to the second DC voltage V2 in the third time period P3, the energy of positive ions that collide with the substrate in the third time period P3 is further enhanced. Thus, the etching rate is further improved.

In an embodiment, steps ST1, ST2, and ST3 may be repeated in this order. In this case, as illustrated in FIG. 2, the method MT further includes step STb. In step STb, it is determined whether a stop condition is satisfied. The stop condition is satisfied when the number of times of the repetition of steps ST1, ST2, and ST3 reaches a predetermined number of times. In addition, the frequency of the repetition of steps ST1, ST2, and ST3, that is, the reciprocal number of (T1+T2+T3) may be 10 kHz or more and 400 kHz or less. Alternatively, the frequency may be higher than 400 kHz.

When it is determined in step STb that the stop condition is not satisfied, step ST1 is performed again. Meanwhile, when it is determined in step STb that the stop condition is satisfied, step STc may be performed. In addition, step STc may be performed after the plasma etching is performed on a plurality of substrates in an order through steps STa and ST1 to ST3.

When step STc is performed, an object to be placed on the support stage 16 is replaced with a dummy substrate from the substrate W processed in steps ST1 to ST3, and the dummy substrate is held by the electrostatic chuck 20. In this case, step STc and steps ST4 to ST6 to be described later are performed in a state where the dummy substrate is placed on the support stage 16. In addition, steps STc and ST4 to ST6 may be performed in a state where no object is placed on the support stage 16. In this case, the substrate W is carried out from the chamber 10 before step STc is performed. Alternatively, steps STc and ST4 to ST6 may be performed in a state where the substrate W processed by steps ST1 to ST3 is placed on the support stage 16.

In step STc, the generation of plasma from a cleaning gas is started. The cleaning gas is a gas used for removing deposits adhering to the inner wall surface of the chamber 10. In step STc, the controller MC controls the gas supply to supply the cleaning gas into the chamber 10. In step STc, the controller MC controls the exhaust device 50 to set the pressure in the chamber 10 to a specified pressure. In step STc, the controller MC controls the radio-frequency power supply 61 to supply a radio-frequency power to the lower electrode 18 (or the upper electrode 30).

The method MT may further include steps ST4, ST5, and ST6. Steps ST4, ST5, and ST6 are performed during the generation of plasma from the cleaning gas that is started in step STc. The performance time period of step ST4 is a fourth time period P4. The performance time period of step ST5 is a fifth time period P5. The performance time period of step ST6 is a sixth time period P6. In order to generate plasma from the cleaning gas, the radio-frequency power may be continuously supplied over the fourth time period P4, the fifth time period P5, and the sixth time period P6.

Step ST4 is performed in the fourth time period P4. The fourth time period P4 is a time period during which plasma is being generated from the cleaning gas in the chamber 10. Step ST4 includes applying a third DC voltage V3 from the power supply unit 64 to the lower electrode 18 in the fourth time period P4. The third DC voltage V3 is a negative DC voltage. The controller MC controls the power supply unit 64 to apply the third DC voltage V3 to the lower electrode 18 in the fourth time period P4.

Step ST5 is performed in the fifth time period P5. The fifth time period P5 is a time period during which the plasma is being generated from the cleaning gas in the chamber 10 after the fourth time period P4. Step ST5 includes stopping the application of the DC voltage from the power supply unit 64 to the lower electrode 18 in the fifth time period P5. In order to perform step ST5, the controller MC controls the power supply unit 64 to stop the output of the DC voltage to the lower electrode 18 in the fifth time period P5.

Step ST6 is performed in the sixth time period P6. The sixth time period P6 is a time period during which the plasma is being generated from the cleaning gas in the chamber 10 after the fifth time period P5. Step ST6 includes applying a fourth DC voltage V4 from the power supply unit 64 to the lower electrode 18 in the sixth time period P6. The fourth DC voltage V4 is a positive DC voltage. In order to perform step ST6, the controller MC controls the power supply unit 64 to apply the fourth DC voltage V4 to the lower electrode 18 in the sixth time period P6.

In the sixth time period P6, since the fourth DC voltage V4, that is, a positive DC voltage is applied to the lower electrode 18, ions are accelerated from the plasma toward the inner wall surface of the chamber 10. As a result, deposits adhering to the inner wall surface of the chamber 10 are removed.

In an embodiment, as illustrated in FIG. 3, the absolute value |V4| of the fourth DC voltage is smaller than the absolute value |V3| of the third DC voltage. In addition, the fourth DC voltage V4 may be the same as the first DC voltage V1. The fourth DC voltage V4 may be zero. However, when the absolute value |V4| of the fourth DC voltage is large, the potential of plasma becomes high, and ions having high energy are supplied toward the inner wall surface of the chamber 10. The third DC voltage V3 may be the same as the second DC voltage V2. In addition, the absolute value |V3| of the third DC voltage may satisfy the condition: |V2|>|V3|≥0. When the condition is satisfied, the absolute value |V3| of the third DC voltage is relatively small. Thus, when step STc and steps ST4 to ST6 to be described later are performed in the state where no object is placed on the support stage 16, the damage to the electrostatic chuck 20 is suppressed.

As illustrated in FIG. 3, the time length T4 of the fourth time period P4 is longer than the sum of the time length T5 of the fifth time period P5 and the time length T6 of the sixth time period P6. That is, the equation T4>T5+T6 is satisfied. In other words, the ratio occupied by the fourth time period P4 in the time period that includes the fourth time period P4, the fifth time period P5, and the sixth time period P6 (i.e., the duty ratio) is larger than 50%. In an embodiment, the time length T4 of the fourth time period P4 is longer than the time length T3 of the third time period P3. That is, in an embodiment, the equation T4>T3 is satisfied. When the time length T4 of the fourth time period P4 is relatively long, the fourth DC voltage V4 increases, and the potential of plasma becomes high in the sixth time period P6. Thus, ions having high energy are supplied toward the inner wall surface of the chamber 10, and the efficiency of the cleaning on the inner wall surface of the chamber 10 is improved. In an embodiment, the time length T6 of the sixth time period P6 is longer than the time length T2 of the second time period P2. That is, in an embodiment, the equation T2<T6 is satisfied. In the present embodiment, the time length of the time period during which the fourth DC voltage V4 is applied becomes long. Thus, the fourth DC voltage V4 is applied as a rectangular voltage, and the effect of the cleaning on the inner wall surface of the chamber 10 is sufficiently exhibited.

In an embodiment, steps ST4, ST5, and ST6 may be repeated in this order. In this case, as illustrated in FIG. 2, the method MT further includes step STd. In step STd, it is determined whether a stop condition is satisfied. The stop condition is satisfied when the number of times of the repetition of steps ST4, ST5, and ST6 reaches a predetermined number of times. In addition, the frequency of the repetition of steps ST4, ST5, and ST6, that is, the reciprocal number of (T4+T5+T6) may be 10 kHz or more and 400 kHz or less. Alternatively, the frequency may be higher than 400 kHz. In addition, (T4+T5+T6) may be equal to (T1+T2+T3).

When it is determined in step STd that the stop condition is not satisfied, step ST4 is performed again. Meanwhile, when it is determined in step STd that the stop condition is satisfied, the method MT is ended.

While various exemplary embodiments have been described, the present disclosure is not limited to the exemplary embodiments described above, and various omissions, substitutions, and modifications may be made. In addition, elements in different embodiments may be combined with each other to form other embodiments.

For example, while the plasma processing apparatus 1 is a capacitively coupled plasma processing apparatus, a plasma processing apparatus according to another exemplary embodiment may be another type of plasma processing apparatus such as an inductively coupled plasma processing apparatus. In addition, the method MT may be performed using any type of plasma processing apparatus other than the plasma processing apparatus 1, for example, an inductively coupled plasma processing apparatus.

According to an exemplary embodiment, it is possible to reduce the positive charge quantity of the substrate and improve the etching rate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus, comprising:
   a chamber;
   a gas source which supplies an etching gas into the chamber;
   a substrate support which supports a substrate;
   an electrostatic chuck;
   a direct current (DC) power supply which supplies a DC voltage to the electrostatic chuck to attract the substrate;
   a source radio-frequency (RF) power supply to supply an RF power;
   a bias power supply for bias that is electrically connected to the substrate support, the bias power supply applying voltage pulses to attract ions; and
   a processor configured to execute a control program to control the bias power supply to:
   (a) stop an application of any non-zero voltage pulse from the bias power supply to the substrate support in a first time period during which an etching plasma is generated from the etching gas in the chamber;
   after (a), (b) apply a first voltage pulse, which is a positive voltage pulse, to the substrate support in a second time period during which the etching plasma is generated from the etching gas in the chamber, the second time period being after the first time period and the second time period being shorter than the first time period;

after (b), (c) apply a second voltage pulse, which is a negative voltage pulse, to the substrate support to etch the substrate in a third time period during which the etching plasma is generated from the etching gas in the chamber, the third time period being after the second time period and the third time period being longer than the second time period; and repeatedly perform (a)-(c) until a condition is satisfied, wherein an application of the first voltage pulse in the second time period is directly switched to an application of the second voltage pulse in the third time period.

2. The plasma processing apparatus according to claim 1, wherein the processor is configured to control the bias power supply so that an absolute value of the first voltage pulse is smaller than an absolute value of the second voltage pulse.

3. The plasma processing apparatus according to claim 1, wherein the processor is configured to control the bias power supply so that a time length of the third time period is equal to or shorter than a sum of a time length of the first time period and a time length of the second time period.

4. The plasma processing apparatus according to claim 3, wherein the processor is configured to control the bias power supply so that the time length of the second time period is equal to or shorter than the time length of the first time period.

5. A plasma processing apparatus, comprising:
a chamber;
a gas source which supplies an etching gas into the chamber;
a substrate support which supports a substrate;
an electrostatic chuck;
a direct current (DC) power supply which supplies a DC voltage to the electrostatic chuck to attract the substrate;
a source radio-frequency (RF) power supply to supply an RF power;
a bias power supply for bias that is electrically connected to the substrate support, the bias power supply applying voltage pulses to attract ions; and
a processor configured to execute a control program to control the bias power supply to:
(a) stop an application of any non-zero voltage pulse from the bias power supply to the substrate support in a first time period during which an etching plasma is generated from the etching gas in the chamber;
after (a), (b) apply a first voltage pulse, which is a positive voltage pulse, to the substrate support in a second time period during which the etching plasma is generated from the etching gas in the chamber, the second time period being after the first time period and the second time period being shorter than the first time period;
after (b), (c) apply a second voltage pulse, which is a negative voltage pulse, to the substrate support to etch the substrate in a third time period during which the etching plasma is generated from the etching gas in the chamber, the third time period being after the second time period and the third time period being longer than the second time period;
repeatedly perform (a)-(c) until a condition is satisfied, wherein an application of the first voltage pulse in the second time period is directly switched to an application of the second voltage pulse in the third time period;

after the condition is satisfied, (d) apply a third voltage pulse, which is a negative voltage pulse, to the substrate support in a fourth time period during which a cleaning plasma is generated from a cleaning gas in the chamber;

after (d), (e) stop the application of the third voltage pulse from the bias power supply to the substrate support in a fifth time period during which the cleaning plasma is generated from the cleaning gas in the chamber after the fourth time period; and after (e), (f) apply a fourth voltage pulse, which is a positive voltage pulse, to the substrate support in a sixth time period during which the cleaning plasma is generated from the cleaning gas in the chamber after the fifth time period, wherein a time length of the fourth time period is longer than a sum of a time length of the fifth time period and a time length of the sixth time period.

6. The plasma processing apparatus according to claim 5, wherein the processor is configured to control the bias power supply so that the time length of the fourth time period is longer than a time length of the third time period.

7. The plasma processing apparatus according to claim 5, wherein the processor is configured to control the bias power supply so that the bias power supply repeats the application of the third voltage pulse to the substrate support in the fourth time period, the stop of the application of the third voltage pulse to the substrate support in the fifth time period, and the application of the fourth voltage pulse to the substrate support in the sixth time period.

8. The plasma processing apparatus according to claim 5, wherein the processor is configured to control the plasma processing apparatus to
provide a workpiece substrate on the substrate support during the first, second and third time periods, and
provide a dummy substrate or no substrate on the substrate support after the third time period, so that the dummy substrate or no substrate is on the substrate support during the fourth time period, the fifth time period and the sixth time period.

9. The plasma processing apparatus according to claim 1, wherein the processor is configured to control the bias power supply so that an end time of the first voltage pulse is a start time of the second voltage pulse.

10. The plasma processing apparatus according to claim 1, wherein the processor is configured to control the bias power supply to, after the condition is satisfied, (d) apply a third voltage pulse, which is a negative voltage pulse, in a fourth time period, and a time length of the fourth time period is longer than a time length of the third time period.

11. The plasma processing apparatus according to claim 10, wherein the processor is configured to control the plasma processing apparatus so that a workpiece substrate is placed on the substrate support during the repeated performing (a)-(c) until the condition is satisfied, and during the application of the third voltage pulse in the fourth time period either a dummy substrate or no substrate is present on the substrate support.

12. The plasma processing apparatus according to claim 11, wherein the processor is configured to control the plasma processing apparatus so that a cleaning plasma of a cleaning gas is provided in the chamber during the fourth time period.

13. The plasma processing apparatus according to claim 1, wherein the processor is configured to control the bias power supply to
during (a), first apply a zero voltage during a start of plasma generation and during the first time period,
directly switch from (a) the zero voltage to (b) the application of the first voltage pulse followed by (c) the application of the second voltage pulse, then
(a) stop any application of a voltage pulse for a predetermined period and (a) apply the zero voltage directly after (c) the application of the second voltage pulse, and
(a) stop any application of a voltage pulse for the predetermined period and apply the zero voltage before (b) a second application of the first voltage pulse.

14. The plasma processing apparatus according to claim 1, wherein
the processor is configured to control the bias power supply so that the second time period immediately follows the first time period such that (b) the application of the first voltage pulse directly follows (a) a stop of any application of the voltage pulse in the first time period, and
the processor is configured to control the bias power supply so that after the repeatedly performing (a)-(c) until the condition is satisfied, power is directly switched between (c) the application of the second voltage pulse to a stop of any application of the voltage pulse.

15. A plasma processing apparatus, comprising:
a chamber;
a gas source which supplies an etching gas into the chamber;
a substrate support which supports a substrate;
an electrostatic chuck;
a direct current (DC) power supply which supplies a DC voltage to the electrostatic chuck to attract the substrate;
a source radio-frequency (RF) power supply to supply an RF power;
a bias power supply for bias that is electrically connected to the substrate support, the bias power supply applying voltage pulses to attract ions; and
a processor configured to execute a control program to control the bias power supply to:
(a) stop an application of any non-zero voltage pulse from the bias power supply to the substrate support in a first time period during which an etching plasma is generated from the etching gas in the chamber;
after (a), (b) apply a first voltage pulse, which is a positive voltage pulse, to the substrate support in a second time period during which the etching plasma is generated from the etching gas in the chamber, the second time period being after the first time period and the second time period being shorter than the first time period;
after (b), (c) apply a second voltage pulse, which is a negative voltage pulse, to the substrate support to etch the substrate in a third time period during which the etching plasma is generated from the etching gas in the chamber, the third time period being after the second time period and the third time period being longer than the second time period; and
repeatedly perform (a)-(c) until a condition is satisfied, wherein an application of the first voltage pulse in the second time period is directly switched to an application of the second voltage pulse in the third time period, wherein
a start time of the second time period is a stop time of the first time period, and
after the repeated performing (a)-(c) until the condition is satisfied, power is directly switched between (c) the application of the second voltage pulse and stoppage of any application of the voltage pulse.

16. The plasma processing apparatus according to claim 1, further comprising:
a gas source group including a plurality of gas sources, wherein
the plurality of gas sources includes the gas source, and
the processor is configured to execute the control program to initiate instructions including:
a first instruction to control the gas source to supply the etching gas to generate the etching plasma with the etching gas with the radio-frequency power supply,
a second instruction to control the bias power supply to stop the application of any voltage pulse while the etching plasma is generated with the etching gas in the first time period,
a third instruction to control the bias power supply to apply the first voltage pulse in the second time period while the etching plasma is generated with the etching gas, and
a fourth instruction to control the bias power supply to apply the second voltage pulse in the third time period while the etching plasma is generated with the etching gas.

17. The plasma processing apparatus according to claim 16, wherein
the plurality of gas sources further includes a cleaning gas source to supply a cleaning gas to the chamber, and
the instructions further include:
a fifth instruction to control the cleaning gas source to supply the cleaning gas to the chamber and generate a cleaning plasma of the cleaning gas with the radio frequency power supply, the fifth instruction being initiated after the fourth instruction, and
a sixth instruction to control the bias power supply to stop any application of the voltage pulse for a predetermined period during which the cleaning plasma of the cleaning gas is generated.

18. The plasma processing apparatus according to claim 17, wherein the processor is further configured to control the bias power supply to:
apply a negative voltage pulse, during a cleaning, having a duration which is longer than a duration of a negative voltage pulse applied during etching;
apply a positive voltage pulse, during the cleaning, having a duration which is longer than a duration of a positive voltage pulse applied during etching; and
provide, immediately prior to execution of the sixth instruction and during generation of the cleaning plasma, a negative voltage pulse to the substrate.

19. The plasma processing apparatus according to claim 5, further comprising:
a gas source group including a plurality of gas sources, wherein
the plurality of gas sources includes the gas source and a cleaning gas source which supplies the cleaning gas to the chamber.

20. The plasma processing apparatus according to claim 19, wherein
a duration of the first time period is T1, a duration of the second time period is T2, a duration of the third time period is T3, a duration of the fourth time period is T4, a duration of the fifth time period is T5, and a duration of the sixth time period is T6, and the processor is configured to control the bias power supply so that T2≤T1.

21. The plasma processing apparatus according to claim 20, wherein the processor is configured to control the bias power supply so that T2<T6 and T4>T3.

22. The plasma processing apparatus according to claim 1, wherein the bias power supply is controlled to perform (c) directly after (b), a duration of the first time period is TI, a duration of the second time period is T2, a duration of the third time period is T3 which is I0usec or less, and

T2<T3.

* * * * *